US006798123B2

(12) United States Patent
Bindig et al.

(10) Patent No.: US 6,798,123 B2
(45) Date of Patent: Sep. 28, 2004

(54) EXTERNAL ELECTRODES ON PIEZOCERAMIC MULTILAYER ACTUATORS

(75) Inventors: Rainer Bindig, Bindlach (DE); Hans-Jurgen Schreiner, Neunkirchen am Sand-Rollhofen (DE)

(73) Assignee: CeramTec AG Innovative Ceramic Engineering, Plochingen (DE)

( * ) Notice: Subject to any disclaimer, the term of this patent is extended or adjusted under 35 U.S.C. 154(b) by 0 days.

(21) Appl. No.: 10/016,488

(22) Filed: Nov. 1, 2001

(65) Prior Publication Data

US 2002/0089266 A1 Jul. 11, 2002

(30) Foreign Application Priority Data

Nov. 6, 2000 (DE) .......................................... 100 54 735
Oct. 24, 2001 (DE) .......................................... 101 52 490

(51) Int. Cl.[7] ............................ H01L 41/04; H01L 41/08
(52) U.S. Cl. ........................ 310/364; 310/365; 310/366
(58) Field of Search ................................ 310/364, 365, 310/366, 363

(56) References Cited

U.S. PATENT DOCUMENTS

| 4,845,339 | A | * | 7/1989 | Kato ........................... 347/207 |
| 5,103,557 | A | * | 4/1992 | Leedy ............................ 438/6 |
| 5,254,212 | A | * | 10/1993 | Someji et al. ................. 216/20 |
| 5,339,068 | A | * | 8/1994 | Tsunoda et al. ............. 338/332 |
| 5,406,164 | A | * | 4/1995 | Okawa et al. ............... 310/366 |
| 5,459,371 | A | * | 10/1995 | Okawa et al. ............... 310/363 |
| 6,183,578 | B1 | * | 2/2001 | Ritter et al. ............. 156/89.12 |
| 6,208,026 | B1 | * | 3/2001 | Bindig et al. ................. 257/718 |
| 6,316,863 | B1 | * | 11/2001 | Schuh et al. ................. 310/328 |
| 6,452,312 | B1 | * | 9/2002 | Hanaki et al. ............... 310/364 |
| 6,462,464 | B2 | * | 10/2002 | Mitarai et al. ............... 310/366 |

FOREIGN PATENT DOCUMENTS

| JP | 60098691 A | * | 6/1985 | ........... H01L/41/08 |
| JP | 61283180 A | * | 12/1986 | ........... H01L/41/08 |
| JP | 61283182 A | * | 12/1986 | ........... H01L/41/08 |
| JP | 63142875 A | * | 6/1988 | ........... H01L/41/08 |
| JP | 07058371 A | * | 3/1995 | ......... H01L/41/083 |
| JP | 07154006 A | * | 6/1995 | ......... H01L/41/083 |
| JP | 07226541 A | * | 8/1995 | ......... H01L/41/083 |
| JP | 07283453 A | * | 10/1995 | ......... H01L/41/083 |
| JP | 08032131 A | * | 2/1996 | ......... H01L/41/083 |

* cited by examiner

Primary Examiner—Tran Nguyen
Assistant Examiner—J. Aguirreche
(74) Attorney, Agent, or Firm—Fulbright & Jaworski L.L.P.

(57) ABSTRACT

External electrodes on piezoceramic multilayer actuators, composed of a layer of a basic metallization applied to the ceramic material of the surface of a actuator, to which metallization there is joined by means of a joining layer a reinforcing layer to which a connecting wire is soldered, wherein the layer of basic metallization is structured by discontinuities or recesses.

28 Claims, 3 Drawing Sheets

EXTERNAL ELECTRODES ON PIEZOCERAMIC MULTILAYER ACTUATORS

BACKGROUND OF THE INVENTION

The invention relates to the external electrodes on piezoceramic multilayer actuators and also to a method of producing them.

The structure and the production of actuators and their external electrodes is described comprehensively, inter alia, in DE 33 30 538 A1, DE 40 36 287 C2, U.S. Pat. No. 5,281,885, U.S. Pat. No. 4,845,339, U.S. Pat. No. 5,406,164 and JP 07-226541 A.

A piezoceramic multilayer actuator is shown diagrammatically in FIG. 1. FIG. 2 shows, in an enlarged detail, the structure of the external electrode according to the prior art and FIG. 3 shows a typical crack path after $10^6$ loading cycles in the ceramic material under an external electrode according to the prior art. Piezoceramic multilayer actuators 1 are constructed as monoliths, that is to say they are composed of stacked thin layers 2 of piezoelectrically active material, for example lead zirconate titanate (PZT) with conductive internal electrodes 7 that are disposed in between and that are alternately routed to the actuator surface. Prior to sintering, as a so-called green film, the active material is provided with internal electrodes 7 by a screen-printing method, pressed to form a stack, pyrolysed and then sintered, which produces a monolithic multilayer actuator 1.

External electrodes 100 formed by basic metallization 3, a connecting layer 8 and a reinforcing layer 4 connect the internal electrodes 7. As a result, the internal electrodes 7 on a respective side of the actuator 1 are connected electrically in parallel and thus combined to form a group. The external electrodes 100 are the connecting poles of the actuator. If an electrical voltage is applied to the connecting poles, it is transmitted in parallel to all the internal electrodes 7 and induces an electric field in all the layers of the active material, which deforms mechanically as a result. The sum of all these mechanical deformations is available at the end faces of the actuator as usable expansion 6 and/or force.

The external electrodes 100 on the piezoceramic multilayer actuators 1 are constructed as follows: a basic metallization 3 is applied to the stack of pressed thin layers 2 of the piezoelectrically active material in the region of the routed-out internal electrodes 10, for example by electroplating methods or screen printing of metal paste. Said basic metallization 3 is reinforced by a further layer 4 composed of a metallic material, for example by a structured metal sheet or a wire lattice. The reinforcing layer 4 is joined to the basic metallization 3, for example, by means of a solder layer 8. The electrical connecting wire 5 is soldered to the reinforcing layer 4.

External electrodes constructed in this way have a serious disadvantage. During operation, severe tensile stresses act on the insulating layer 11 that is situated underneath the basic metallization 3. Since the insulating region 11 forms a homogeneous unit together with the basic metallization 3 and the joining layer 8, as a rule a solder layer, said unit breaks down when the tensile strength of the weakest member is exceeded and cracks are formed. The cracks usually run from the brittle and low-tensile basic metallization 3 into the insulating region 11 and are trapped there by regions having high tensile stresses, preferably at the electrode tips 9 of the electrodes 12, which do not touch the basic metallization 3, or they start in the regions of maximum tensile stress at the electrode tips 9 and extend in the direction of the basic metallization 3. These typical cracks 14 are shown in FIG. 3.

The spreading of a crack 13 along an internal electrode 10 touching the basic metallization 3 is classified as not critical since such a crack path does not impair the function of the actuator. On the other hand, cracks 14 that extend in an uncontrolled manner through the insulating region 11 are very critical since they reduce the insulating distance and considerably increase the probability of actuator failure due to flashovers.

Solutions to the problem are described, for example, in Patent Applications DE 198 60 001 A1, DE 394 06 19 A1 and DE 196 05 214 A1. In the latter, it is proposed to provide the region between an electrode not touching the basic metallization and the basic metallization with a filling material of low tensile strength or a cavity. The important disadvantages of this procedure are to be perceived in the fact that the filling material has to be applied by means of an additional, complex method step and that the filling material inevitably adversely affects the properties of the actuator and, in the case of the introduction of cavities, the latter have to be closed again in a further method step prior to the application of the basic metallization.

Another solution to this problem is proposed in DE 199 28 178 A1. In this case, the monolithic structure is broken down into small subregions and reconstructed in an alternating manner with inactive, electrode-free regions. In this case, the maximum possible tensile stress is intended to remain below the value necessary for crack formation within an active region. The method is difficult from a production-engineering standpoint and does not result in the necessary reduction in the stresses in the insulating region, with the result that a latent danger of cracks always continues to exist.

OBJECTS AND SUMMARY OF THE INVENTION

The object of the invention is to design the external electrodes on multilayer actuators in such a way that the causes of crack formation in the actuators are avoided as far as possible and that, if cracks occur, their path is controlled in such a way that it does not result in the destruction of the actuators.

The object is achieved, according to the invention, in that the basic metallization of the external electrode is no longer a continuous area, but is structured, the structuring being formed by discontinuities or recesses. Further advantageous embodiments of the invention are claimed in the dependent claims.

The structuring of the basic metallization in the outer electrode reduces, in totality, the rigidity of the composite comprising ceramic surface, basic metallization and joining layer, as a result of which preferred directions for the crack spreading are produced when cracks occur. The structuring has the effect that the mechanical reaction of the external electrode on the actuator and, consequently, also the crack initiation is reduced without endangering the adhesive strength of the external electrode and the reliable contacting of the internal electrodes.

However, as a result of the structuring of the basic metallization, areas must remain that are at least large enough for respective adjacent internal electrodes to be joined together by at least one area.

Furthermore, the discontinuity of the basic metallization in the external electrode produces, at the actuator surface, regions in which an interaction takes place between the joining layer that joins the reinforcing layer to the basic metallization, in particular in the case of a solder layer, and the internal electrodes routed outwards. As a result of the discontinuities in the structure of the basic metallization, metal from the solder may become alloyed to the internal electrodes when the reinforcing layer is soldered on. The consequence is that the insulating regions are weakened at these points, which produces preferred points for possible crack formations and the crack path. As a result of the control of soldering time and soldering temperature, the penetration effect can be adjusted so that, during the subsequent operation of the actuator, almost every internal electrode becomes a deflector for a developing crack. The stress in the microstructure of the insulating region is thereby reduced to a maximum extent, the cracks remain harmless and cracks can no longer be formed that extend through the ceramic material. No additional steps need to be formed in the manufacturing process. Because of the low process temperature during soldering, the ceramic material is not damaged.

In the case of multilayer actuators having the basic metallization structured according to the invention, cracks are therefore formed exclusively along the internal electrodes routed outwards and these are advantageously not critical because they do not impair the function of the actuator.

The invention is explained in greater detail by reference to exemplifying embodiments.

DETAILED DESCRIPTION

Figure 1:
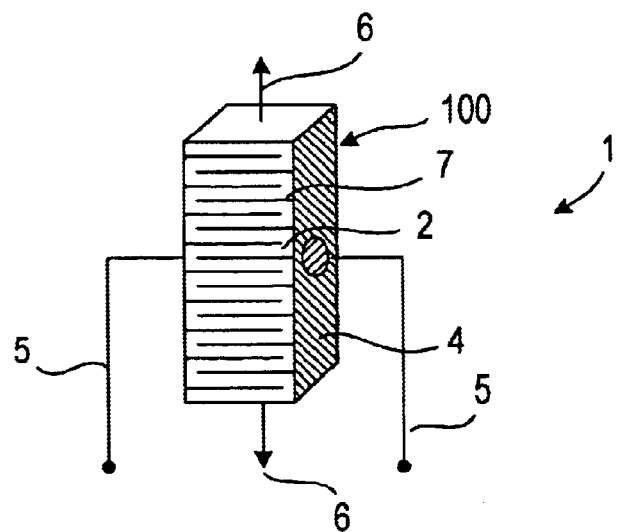
FIG. 1 is a diagammatical drawing of a prior art piezoceramic multilayer actuator.

The diagrammatic structure of the multilayer actuators used here corresponds to that shown in FIG. 1. The external electrodes according to the invention differ from the external electrodes shown in FIGS. 2 and 3 in the structuring of the basic metallization.

The structuring, according to the invention, of the basic metallization was tested on five exemplifying embodiments. For this purpose, parent bodies of multilayer actuators were first produced according to FIG. 1 and the basic metallization was applied to them in various patterns. The external electrodes of the actuators were then completed.

The parent bodies of the actuators are produced as described below: from a piezoceramic material that sinters at low temperature, for example SKN53 according to DE 198 40 488 A1, a 125 $\mu$m-thick film is prepared using an organic binder system. An internal electrode paste composed of silver/palladium powder in a weight ratio of 70/30 and a suitable binder system are applied to said film by means of screen printing. A multiplicity of such films is stacked and pressed to form a laminate. The laminate is separated into individual rod-shaped actuators, and the latter are pyrolysed at about 400° C. and sintered at about 1100° C. The actuator parent bodies are then mechanically machined on all sides.

Figure 2:
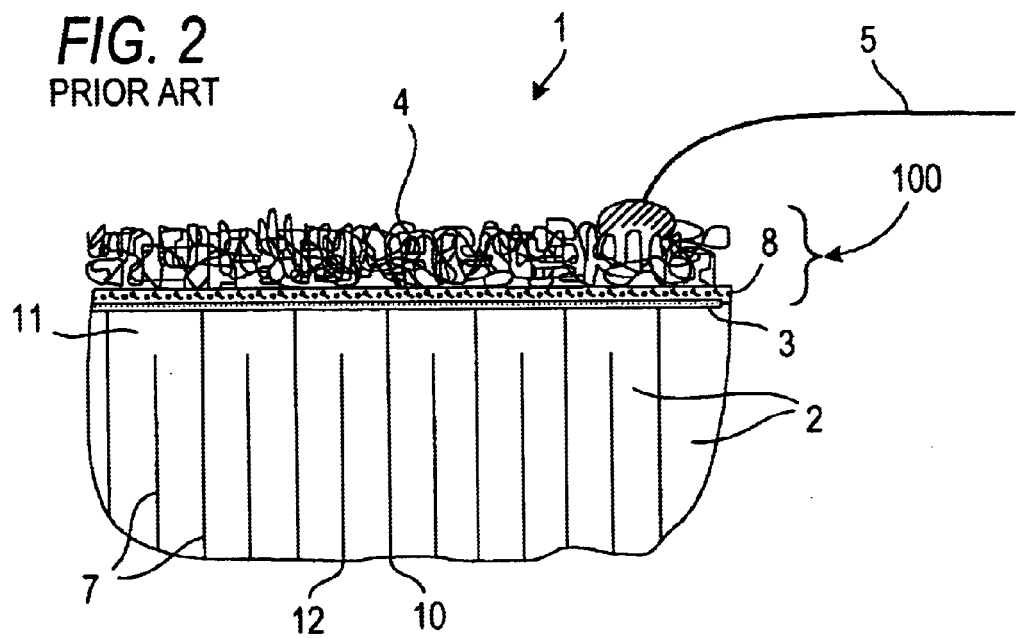
FIG. 2 is an enlarged detail of an external electrode according to the prior art.
Figure 3:
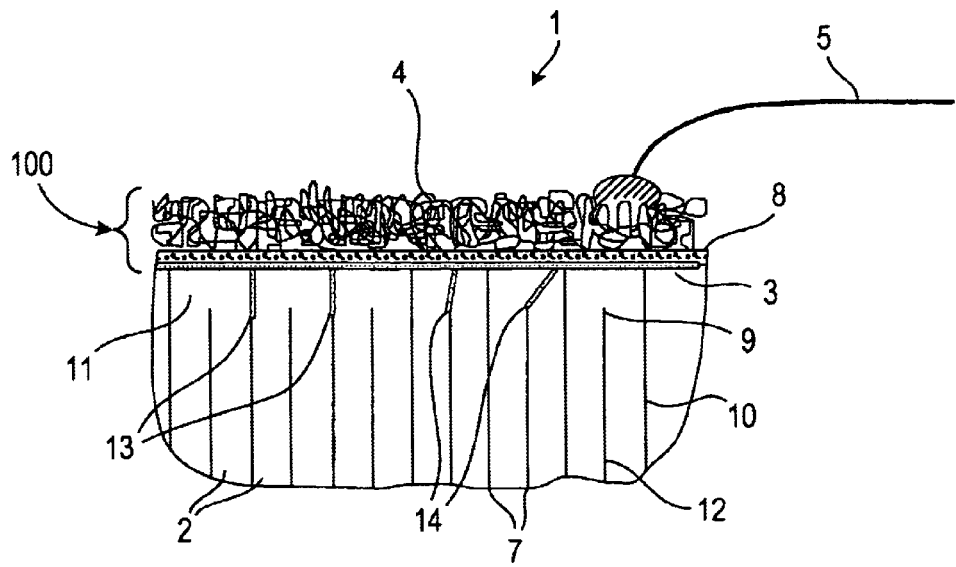
FIG. 3 shows a typical crack path after $10^6$ loading cycles in the ceramic material under an external electrode according to the prior art.
Figure 4:
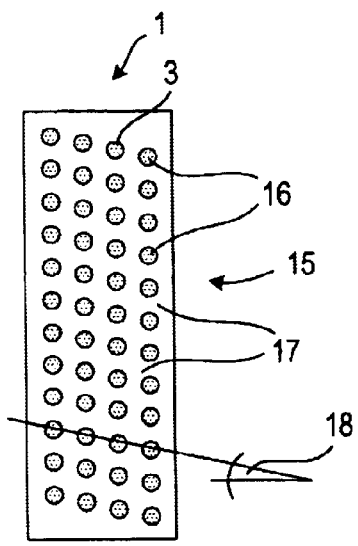
FIG. 4 shows a basic metallization that has been produced by means of screen printing with a termination paste, having a structure according to the invention composed of individual dots.
Figure 5:
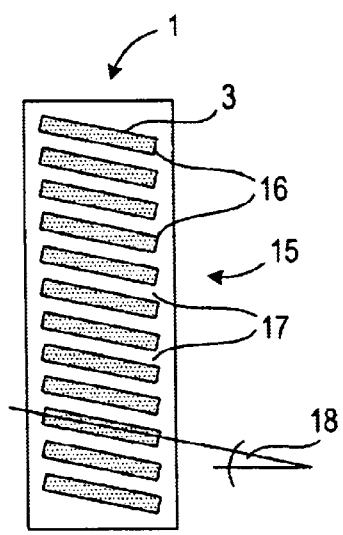
FIG. 5 shows a basic metallization having a structure according to the invention composed of individual lines.
Figure 6:
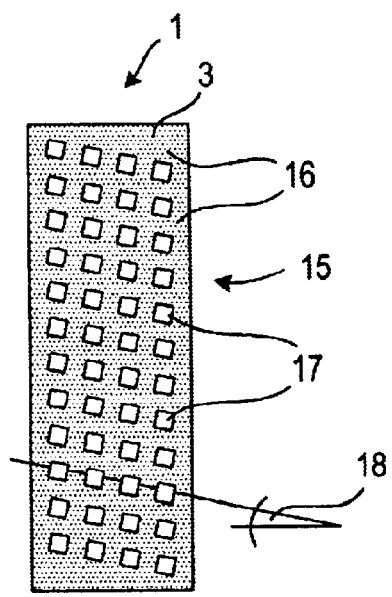
FIG. 6 shows a basic metallization with a lattice-type structure according to the invention.

The basic metallization 3, composed, for example, of a suitable silver/palladium termination paste, is applied by means of screen printing, in which process a structure 15 is produced in that the printed areas 16 are interrupted by unprinted areas 17 as shown in FIGS. 4 to 6. The firing process then takes place. The resultant punctiform, line-type or lattice-type raster 15 composed of printed areas 16 should be as fine as possible, it being necessary to ensure that respective adjacent internal electrodes 10, which are routed to the surface of the actuator 1 in accordance with FIG. 2, are joined together by at least one printed-on area 16. In order to achieve that, it is expedient to arrange for the raster 15 to extend at an angle, characterized by 18 in FIGS. 4 to 6, with respect to the direction of the internal electrodes 10. If the structure is too fine, the strength of the composite drops with respect to the subsequently applied reinforcement layer, for example a soldered-on lattice electrode. With a spacing of the internal electrodes 10 of 100 $\mu$m, a printed region 16 of the basic metallization 3 of 0.2 to 0.3 mm with equally large discontinuities 17 has proved particularly advantageous.

Figure 7:
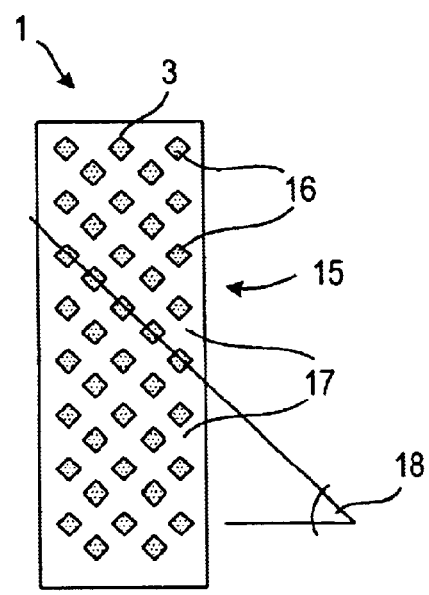
FIG. 7 shows a basic metallization having a structure according to the invention that has been formed from a metallization printed over the entire area by mechanical removal.

The basic metallization may also be structured by local mechanical removal of a layer applied over the entire surface, for example, by sawing or scratching. The structure can furthermore be produced by an electrochemical process, use being made of the fact that electrochemically deposited metals are porous. A structure 15 produced in this way is shown in FIG. 7.

After the firing of the basic metallization, the external electrodes are completed by means of the reinforcing layer, for example by soldering on a metal-wire lattice. The actuators can then be polarized and their properties measured.

Samples of four exemplifying embodiments having external electrodes according to the invention are compared below with samples having external electrodes according to the prior art.

The actuator parent bodies of the samples, which have been produced according to the method described above, have dimensions of 10×10 mm$^2$ base area and a height of 30 mm. The thickness of an individual ceramic layer after sintering is 100 $\mu$m and the thickness of an internal metallization layer is 2 $\mu$m. The actuator parent bodies are processed further as follows:

For actuators according to the prior art as reference, the basic metallization 3 composed of a suitable AgPd termination paste is applied by means of screen printing, no structure being produced. The layer is uniformly thick and the layer thickness is 8 $\mu$m after firing at 800° C.

For the first exemplifying embodiment, the basic metallization 3 composed of a suitable AgPd termination paste is applied by means of screen printing, a raster-type structure 15 composed of round dots 16, comparable to the pattern in FIG. 4, being produced. The dot diameter is 0.2 mm and the free space 17 between two dots is likewise 0.2 mm. The raster 15 is inclined at an angle 18 of 20° to the direction of the internal electrodes 10, with the result that respective adjacent internal electrodes 10 are joined together by means of at least one printed-on area 16. The dot layer is uniformly thick and the layer thickness is 9 μm after firing at 800° C.

For the second exemplifying embodiment, the basic metallization 3 composed of a suitable AgPd termination paste is applied by means of screen printing, a line-type structure 15 comparable to the pattern in FIG. 5 being produced. The width of the lines 16 is 0.2 mm and the distance 17 between two lines is likewise 0.2 mm. As in the case of the first exemplifying embodiment, the lines 16 are inclined at an angle 18 with respect to the direction of the internal electrodes 10. The layer of the line structure 15 is uniformly thick and the layer thickness is 9 μm after firing at 800° C.

For the third exemplifying embodiment, the basic metallization 3 composed of a suitable AgPd termination paste is applied by means of screen printing, no structure being produced. The layer is uniformly thick and the layer thickness is 8 μm after firing at 800° C. A raster 15 composed of squares 16 is produced in the basic metallization 3 by cutting the layer into squares 16, comparable to the pattern in FIG. 7, that are 0.2 mm in size by means of a diamond saw. The distance 17 between the squares 16 is 0.1 mm. The lines connecting the squares in the raster 15 extend at an angle 18 of 35° to the direction of the internal electrodes so that respective adjacent internal electrodes are covered by at least one square.

For the fifth exemplifying embodiment, which is not shown here, the basic metallization is deposited electrochemically in the form of a nickel layer. The nickel layer is about 2 μm thick and is covered by a likewise electrochemically deposited 0.1 μm-thick gold layer. The gold layer improves the solderability and has no other function. Due to the method, the nickel layer is not completely continuous and has a fine, lattice-like structure, discontinuities being present in the order of magnitude of the ceramic particles of about 5 and 10 μm.

The external electrodes on the fifth exemplifying embodiments are completed by means of a soldered-on wire lattice using a suitable process. As lattice material, a material comparable to the thermal coefficient of expansion of the ceramic, for example $FeNi_{36}$, is used. The wire diameter is 100 μm and the mesh size 200 μm. The lattice is pretreated by electroplating, for example copper-plated, in order to improve the solderability. $SnAg_4$ is used as solder. The solder time is 10 minutes at 2400° C.

After soldering, it is optically observable that, in the case of variants 2 to 5 of the exemplifying embodiments, the solder has wetted the internal electrodes even in the areas not provided with basic metallization.

The actuators are cleaned and insulated using a suitable lacquering. After the connecting wires have been soldered onto the electrode lattices, the actuators are prestressed at 2000 N in test frames and activated by means of a trapezoidal signal. In this process, the activation voltage is boosted in 100 μs from 0 V to 200 V, held for 1 ms at 200 V and then reduced to 0 V in 100 μs. The repetition frequency is 200 Hz. In this process, the actuators reach operating temperatures of 150 to 160° C.

Variant 1 exhibits a distinct and severe crack formation even for $10^6$ cycles. The cracks cut through the insulating zone in random directions, but cracks along the internal electrodes are rather rare.

Variants 2 and 3 exhibit almost identical behaviour, which differs markedly from variant 1. At $10^6$ cycles, hardly any visible crack formation occurs. At $10^7$ cycles crack formation occurs. All the cracks extend along the internal electrodes and occur about twice as frequently as in the case of variant 1, but are markedly less pronounced. This state remains unaltered even after $10^8$ cycles.

Variant 4 shows the most favourable crack behaviour. Marked crack formation occurs only from $10^8$ cycles onwards. All the cracks likewise extend along the internal electrodes. In this variant, however, the squares of the square raster 16 easily shear away from the ceramic. The reason is that the junction between basic metallization and ceramic was damaged at the periphery of the squares during the sawing process. Damage to the ceramic material can be avoided by optimizing the cuts in the basic metallization. Damage to the ceramic material can likewise be avoided by a suitable etching method.

Variant 5 shows a crack behaviour similar to variants 2 and 3, but the adhesive strength of the nickel to the ceramic is inadequate. Detachment of the basic metallization from the ceramic gradually occurs locally, as a result of which the function of the actuator may be impaired in the case of long running times.

What is claimed is:

1. An external electrode for a piezoceramic multilayer actuator, comprising a layer of a basic metallization applied to a ceramic material on a surface of the actuator, a reinforcing layer joined to said basic metallization by a joining layer; wherein a connecting wire is soldered to said reinforcing layer, and wherein the layer of basic metallization is structured by discontinuities or recesses.

2. An external electrode according to claim 1, wherein the structure of the basic metallization is composed of a printed pattern of a suitable termination paste, which printed pattern has been produced by means of a printing method.

3. An external electrode according to claim 2, wherein the basic metallization is composed of a suitable termination paste that has the composition $Ag_xPd_y$, where $x+y=1$ and $1>x>0$.

4. An external electrode according to claim 1, wherein the structure of the basic metallization is formed by a mechanical, chemical or electrochemical removal in a layer of the basic metallization applied over the entire area.

5. An external electrode according to claim 1, wherein the structure of the basic metallization is formed by a porous electrochemical deposition of a suitable metallic material.

6. An external electrode according to claim 5, wherein the metallic material is nickel.

7. An external electrode according to claim 1, wherein the structure of the basic metallization is composed of areas disposed over the surface of the actuator and the areas are at least large enough for respective adjacent internal electrodes to be joined together by at least one area.

8. An external electrode according to claim 1, wherein the structure of the basic metallization is composed of dots, in that the diameter of the dots is equal to 0.05 to 5 times the thickness of the ceramic layers of the actuator, in that the minimum distance between the dots is likewise equal to 0.5 to 5 times the thickness of the ceramic layers of the actuator, and in that a straight line extending through the dots encloses an angle with respect to the path of the internal electrodes that is approximately between 10 degrees and 80 degrees, preferably between 15 degrees and 40 degrees.

9. An external electrode according to claim 1, wherein the diameter of and the spacing between the dots are equal to two to three times the thickness of the ceramic layer of the actuator.

10. An external electrode according to claim 1, wherein the structure of the basic metallization is composed of parallel lines, in that the width of the lines is equal to 0.5 to 5 times the thickness of the ceramic layers of the actuator, in that the minimum distance between the lines is likewise equal to 0.5 to 5 times the thickness of the ceramic layers of the actuator, and in that the lines enclose an angle with respect to the path of the internal electrodes that is approximately between 10 to 80 degrees.

11. An external electrode according to claim 10, wherein the width of and the spacing between the lines are equal to 2 to 3 times the thickness of the ceramic layers of the actuator.

12. An external electrode according to claim 1, wherein the structure of the basic metallization is composed of lines disposed in grid-type manner, in that the width of the lines is equal to 0.5 to 5 times the thickness of the ceramic layers of the actuator, in that the minimum distance between the lines is likewise equal to 0.5 to 5 times the thickness of the ceramic layers of the actuator, and in that the lines of the grid are at a random angle with respect to one another and to the path of the internal electrodes.

13. An external electrode according to claim 1 wherein said basic metallization has no cracks therein.

14. An external electrode according to claim 1, wherein the joining layer between the metallization and reinforcing layer is composed of a solder that contains at least one of the metals Sn, Ag, Cu, Pb, Au, In, Ga.

15. An external electrode according to claim 14, wherein the solder is a tin-containing material.

16. An external electrode according to claim 15, wherein said tin-containing material is selected from the group consisting of $SnAg_4$ and $SnCu_{0.7}$.

17. An external electrode according to claim 1, wherein the joining layer between basic metallization and reinforcing layer is an electrically conductive adhesive.

18. A method for producing external electrodes according to claim 1, wherein the layer of the basic metallization is structured by discontinuities and recesses.

19. A method according to claim 18, wherein the structure of the basic metallization is produced as a printed pattern by means of a printing method using a suitable termination paste.

20. A method according to claim 19, wherein the structure of the basic metallization is formed by a mechanical, chemical or electrochemical removal in a layer of the basic metallization applied over the entire area.

21. A method according to claim 18, wherein the basic metallization is produced from a suitable termination paste that has the composition $Ag_xPd_y$, where x+y=1 and 1>x>0.

22. A method according to claim 18, wherein the structure of the basic metallization is formed by a porous electrochemical deposition of a suitable metallic material.

23. A method according to claim 22, wherein nickel is used as metallic material.

24. A method according to claim 18, wherein the structure of the basic metallization is formed from areas distributed over the surface of the actuator and areas are produced that are at least large enough for respectively adjacent internal electrodes to be jointed together by at least one area.

25. A method according to claim 1, wherein the reinforcing layer is soldered onto the basic metallization, and in that the solder contains at least one of the metals Sn, Ag, Cu, Pb, Au, In, Ga.

26. A method according to claim 25, wherein the solder is a tin-containing material.

27. A method according to claim 26, wherein said tin-containing material is selected from the group consisting of $SnAg_4$ and $SnCu_{0.7}$.

28. A method according to claim 25, wherein that metal from the solder is alloyed into the internal electrodes by the discontinuities in the structure of the basic metallization, and the ceramic material is weakened at these points, as a result of which preferred points are formed for possible crack formation and the crack path.

* * * * *